United States Patent
Bae et al.

(10) Patent No.: US 7,569,430 B2
(45) Date of Patent: Aug. 4, 2009

(54) PHASE CHANGEABLE STRUCTURE AND METHOD OF FORMING THE SAME

(75) Inventors: Jun-Soo Bae, Gyeonggi-do (KR); Hideki Horii, Seoul (KR); Ji-Hye Yi, Gyeonggi-do (KR); Young-Soo Lim, Chungcheongbuk-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/674,580

(22) Filed: Feb. 13, 2007

(65) Prior Publication Data
US 2007/0190683 A1    Aug. 16, 2007

(30) Foreign Application Priority Data
Feb. 13, 2006  (KR) .................. 10-2006-0013431
Feb. 6, 2007   (KR) .................. 10-2007-0011995

(51) Int. Cl.
*H01L 21/82* (2006.01)
(52) U.S. Cl. ................. 438/132; 257/E45.002
(58) Field of Classification Search ............... 438/102, 438/131, 132, 900; 257/2–4, 42, 529, 530, 257/E45.002; 365/148
See application file for complete search history.

(56) References Cited

U.S. PATENT DOCUMENTS

| 6,329,666 B1 | 12/2001 | Doan et al. |
| 6,831,019 B1 * | 12/2004 | Li et al. ............... 438/714 |
| 2005/0032374 A1 | 2/2005 | Spandre et al. |
| 2007/0154847 A1 * | 7/2007 | Chen et al. .............. 430/313 |
| 2007/0166870 A1 * | 7/2007 | Lim et al. ................ 438/95 |
| 2007/0224796 A1 * | 9/2007 | Lim et al. ............... 438/597 |
| 2007/0249090 A1 * | 10/2007 | Philipp et al. ........... 438/102 |

FOREIGN PATENT DOCUMENTS

KR    2003-0080843    10/2003

* cited by examiner

*Primary Examiner*—David Vu
(74) *Attorney, Agent, or Firm*—Marger Johnson & McCollom, P.C.

(57) ABSTRACT

The present invention relates to a phase changeable structure having decreased amounts of defects and a method of forming the phase changeable structure. A stacked composite is first formed by (i) forming a phase changeable layer including a chalcogenide is formed on a lower electrode, (ii) forming an etch stop layer having a first etch rate with respect to a first etching material including chlorine on the phase changeable layer, and (iii) forming a conductive layer having a second etch rate with respect to the first etching material on the etch stop layer. The conductive layer of the stacked composite is then etched using the first etching material to form an upper electrode. The etch stop layer and the phase changeable layer are then etched using a second etching material that is substantially flee of chlorine to form an etch stop pattern and a phase changeable pattern, respectively.

14 Claims, 3 Drawing Sheets

PHASE CHANGEABLE STRUCTURE AND METHOD OF FORMING THE SAME

CROSS-REFERENCE TO RELATED APPLICATION

This application claims the benefit of Korean Patent Application No. 10-2006-0013431 filed on Feb. 13, 2006 and Korean Patent Application No. 10-2007-11995 filed on Feb. 6, 2007, the disclosures of which are incorporated herein by reference in their entireties.

FIELD OF THE INVENTION

The present invention relates to a phase changeable structure and a method of forming the phase changeable structure. More particularly, the present invention relates to a phase changeable structure having decreased defects and a method of forming the phase changeable structure.

BACKGROUND OF THE INVENTION

Nonvolatile memory devices have garnered much interest in recent times, including nonvolatile memory devices made of a phase changeable structure. Referencing FIG. 1, a phase changeable structure typically includes a lower electrode 200 formed in a substrate 100 (e.g., insulating layer), a phase changeable pattern 310 and an upper electrode 410. A phase changeable pattern can be obtained from etching a phase changeable layer using a mask pattern. The phase changeable pattern is typically located between the lower electrode and the upper electrode and can include a chalcogenide (or calcogenide).

Typically, a predetermined amount of current (e.g., generated by a difference in voltage between the lower electrode and the upper electrode) can be applied to the phase changeable pattern to induce a change in phase from a single crystalline state having a relatively low electric resistance into an amorphous state having a relatively high electric resistance. In addition, if the current applied to the phase changeable pattern is reduced or removed, the phase changeable pattern may be changed from the amorphous state into the single crystalline state.

Generally, after forming a stacked composite of material comprising a phase changeable layer and a conductive material over the phase changeable layer, a first etching process is performed on the conductive material to form an upper electrode. Thereafter, a second etching process is performed on the phase changeable layer to form the phase changeable pattern.

When a conventional etching material (e.g., a chlorine-containing etchant) is used in the first etching process to form the upper electrode, an unacceptable number of defects can be generated at an upper face portion of the phase changeable pattern which contacts the upper electrode. In addition, the use of a conventional etching material (e.g., a chlorine-containing etchant) in the second etching process to form the phase changeable pattern can further contribute to an unacceptable number of defects, e.g., generated at the interface between the phase changeable pattern and the upper electrode and/or at a side face portion of the phase changeable pattern. It is believed that chlorine may reside on a side face of the phase changeable pattern or at an interface between the phase changeable pattern and the upper electrode. It is also believed that this remaining chlorine residue or a byproduct thereof may contribute to defect formation, such as via erosion, in succeeding processes.

An illustration of typical defects, that can be formed, is illustrated in FIG. 1. Defects can occur between the phase changeable pattern 310 and the top electrode 410 as illustrated by reference number 302 in either or both portions of the phase changeable structure. Defects can also occur on a side face of the phase changeable pattern 310, as illustrated by reference numbers 304 and 306. Defects can also occur between phase changeable pattern 310 and the substrate 100 (e.g., insulating layer), as illustrated by reference number 306.

SUMMARY OF THE INVENTION

The present invention provides a phase changeable structure including a phase changeable pattern having a reduced number or amount of defects and a method of forming the phase changeable structure. The present invention also provides a method of forming the phase changeable pattern.

In accordance with an embodiment of the present invention, there is provided a phase changeable pattern. The phase changeable structure includes a lower electrode, a phase changeable pattern formed on the lower electrode, a conductive etch stop pattern comprising zirconium formed on the phase changeable pattern, and an upper electrode formed on the conductive etch stop pattern.

The phase changeable pattern may include a chalcogenide. The chalcogenide may include germanium, antimony and tellurium. The conductive layer may include titanium nitride.

In accordance with another embodiment of the present invention, there is provided a method of forming a phase changeable structure. In the method, a lower electrode is first formed. A phase changeable layer including a chalcogenide is then formed on the lower electrode. A conductive etch stop layer is then formed on the phase changeable layer, and the etch stop layer is chosen to have a first etch rate with respect to a first etching material including chlorine. A conductive layer is then formed on the etch stop layer, and the conductive layer is chosen to have a second etch rate that is higher than the first etch rate. The conductive layer is etched using the first etching material to form an upper electrode. The conductive etch stop layer and the phase changeable layer are then etched using a second etching material that is substantially free of chlorine to form an etch stop pattern and a phase changeable pattern, respectively.

The chalcogenide may include germanium, antimony and tellurium. The conductive layer and the etch stop layer preferably includes titanium nitride and zirconium, respectively. The first etching material may further include a noble gas selected from the group consisting of helium, neon, argon, krypton, xenon, radon, and any combination thereof. The first etching material may have a plasma state.

In still another embodiment, the conductive layer may be etched in a chamber having a source electrode and a bias electrode. Electrical power is preferably applied to the source electrode and the bias electrode at a ratio from about 2.5:1 to about 20:1, and the chamber can be maintained at about 1 mTorr to about 20 mTorr.

According to the present invention, a phase changeable pattern provided between a lower electrode and an etch stoop pattern may have a side face portion and/or an upper face portion having a reduced number of defects.

BRIEF DESCRIPTION OF THE DRAWINGS

The above and other advantages of the present invention will become readily apparent by reference to the following detailed description when considered in conjunction with the accompanying drawings in which.

DESCRIPTION OF THE EMBODIMENTS

Figure 1:
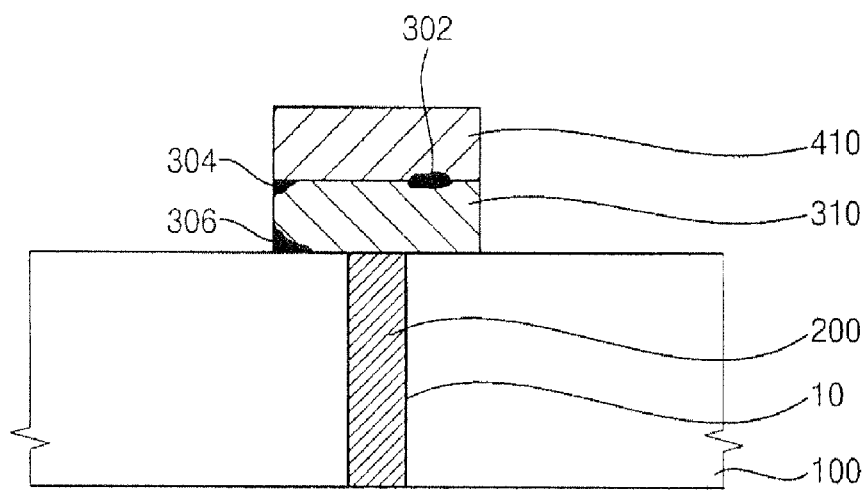
FIG. 1 is a cross-sectional view illustrating a phase changeable structure having typical defects.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the relative sizes of layers and regions may be exaggerated for clarity. The drawings are not to scale. Unless otherwise indicated, like reference numerals designate like elements throughout the drawings.

It will also be understood that when an element or layer is referred to as being on, "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "tipper" and the like may be used to describe an element and/or features relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

Phase Changeable Structure

Figure 2:
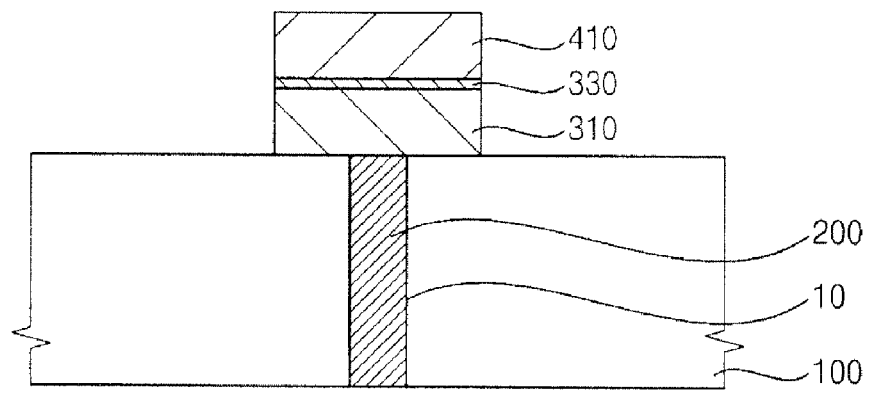
FIG. 2 is a cross-sectional view illustrating a phase changeable structure in accordance with an embodiment of the present invention.

FIG. 2 is a cross-sectional view illustrating a phase changeable structure in accordance with an example embodiment of the present invention.

Referring to FIG. 2, a phase changeable structure includes an insulating layer 100, a lower electrode 200, a phase changeable pattern 310, an etch stop pattern 330 comprising zirconium, and an upper electrode 410. The phase changeable pattern 310 is provided on the insulating layer 100 and the lower electrode 200 such that the phase changeable pattern 310 may make electric contact with the lower electrode 200. The etch stop pattern 330 is provided on the phase changeable pattern 310. The upper electrode 410 is provided on the etch stop pattern 330.

The upper electrode 410 can be formed by etching a conductive layer. The conductive layer may be etched using a first etching material including chlorine. The conductive layer may include a conductive material allowing the conductive layer to have a first etch rate with respect to the first etching material. The upper electrode conductive material may include tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or any combination thereof. Alternatively, the upper electrode conductive material may include polysilicon doped with impurities. The conductive material (for forming the upper electrode) preferably includes titanium nitride.

The etch stop pattern 330 may be formed by etching an etch stop layer. The etch stop layer may be etched using a second etching material that is substantially free of chlorine. The etch stop layer may include a conductive material allowing the etch stop layer to have a second etch rate with respect to the first etching material. The second etch rate may be larger than the first etch rate. When the upper electrode conductive material includes titanium nitride, it is preferred to include zirconium in the etch stop conductive material.

As described above, the first etching material can include a chlorine-containing compound, e.g., $Cl_2$ and $BCl_3$. In addition, the first etching material may further include other useful etchant compounds, nonlimiting examples of which include helium, neon, argon, krypton, xenon, radon and any combination thereof. It is preferred to have the first etching material in a plasma state.

As described above, the second etching material is substantially free of chlorine. The second etching material may include a noble gas selected from the group consisting of helium, neon, argon, krypton, xenon, radon, and any combination thereof. It is also preferred to have the second etching material in a plasma state In addition, the second etching material may further include a fluorine-containing compound and/or a hydrogen-containing compound. Nonlimiting examples of useful fluorine-containing compounds can be selected from the group consisting of tetraflouromethane, trifluoromethane, difluoromethane, monofluoromethane, and any combination thereof. Nonlimiting examples of useful hydrogen-containing compounds can be selected from the group consisting of $H_2$, HBr, $NH_3$, $N_2H_4$, $C_xH_y$ (e.g., $CH_4$), and any combination thereof. Any $C_xH_y$ gas, which might be utilized, can be straight-chained or ringed. All of these additional etching materials can be used in a mixture with helium, neon, argon, krypton, xenon, radon or any combination thereof.

The phase changeable layer may be etched to form the phase changeable pattern 310. It is, however, preferable to etch the phase changeable layer in one continuous etching step subsequent to etching the etch stop layer. The phase changeable layer may be etched using the same second etching material used to etch the etch stop layer. The phase changeable layer 300 may include a chalcogenide. Nonlimiting examples of useful chalcogenides include germanium (Ge), antimony (Sb), tellurium (Te), and any combination thereof in any atomic proportions.

The insulating layer 100 has a hole 10. The insulating layer 100 may include oxide or nitride. For example, the insulating layer 100 may include phosphor silicate glass (PSG), borophosphor silicate glass (BPSG), undoped silicate glass (USG), spin on glass (SOG), tetra ethyl ortho silicate (TEOS), plasma enhanced-TEOS (PE-TEOS), flowable oxide (FOX), high density plasma-chemical vapor deposition (HDP-CVD) oxide or silicon nitride.

The lower electrode 200 is provided in the hole 10. The lower electrode 200 may include metal, metal nitride or a combination thereof. For example, the lower electrode 200 may include tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or any combination thereof. Alternatively, the lower electrode 200 may include polysilicon doped with impurities. An upper face of the insulating layer 100 may be substantially coplanar with an upper face of the lower electrode 200.

Method of Forming a Phase Changeable Structure

Figure 3:
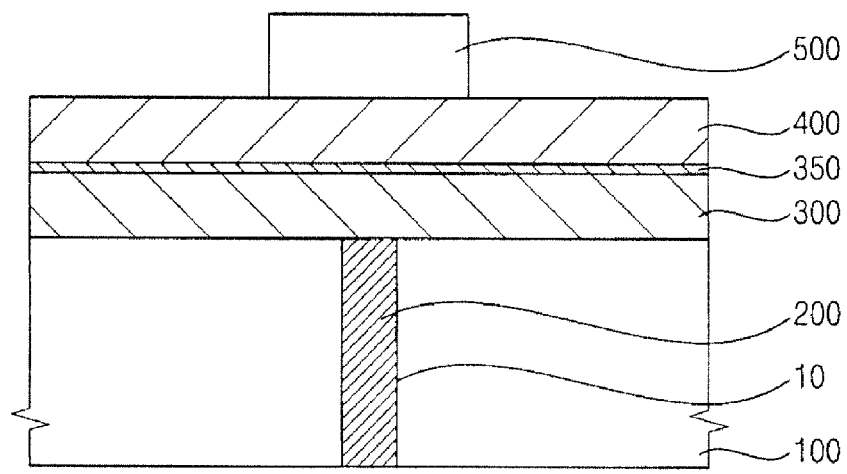
FIGS. 3 to 5 are cross-sectional views illustrating a method of forming the phase changeable structure in FIG. 2.
Figure 4:
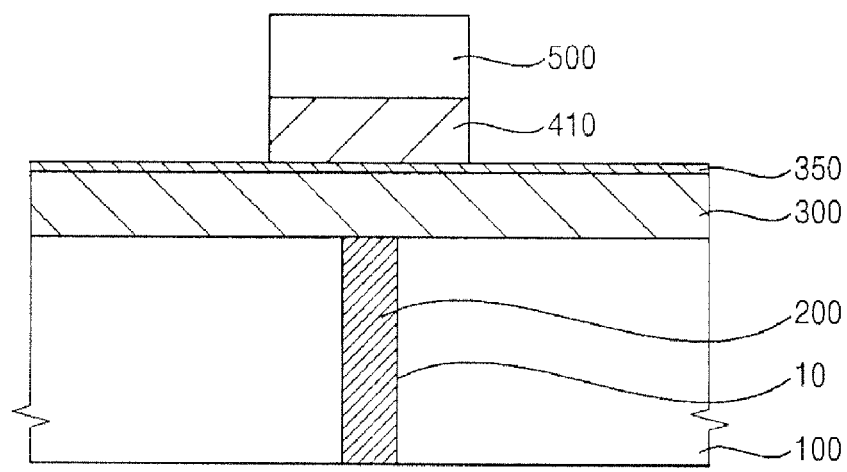
Figure 5:
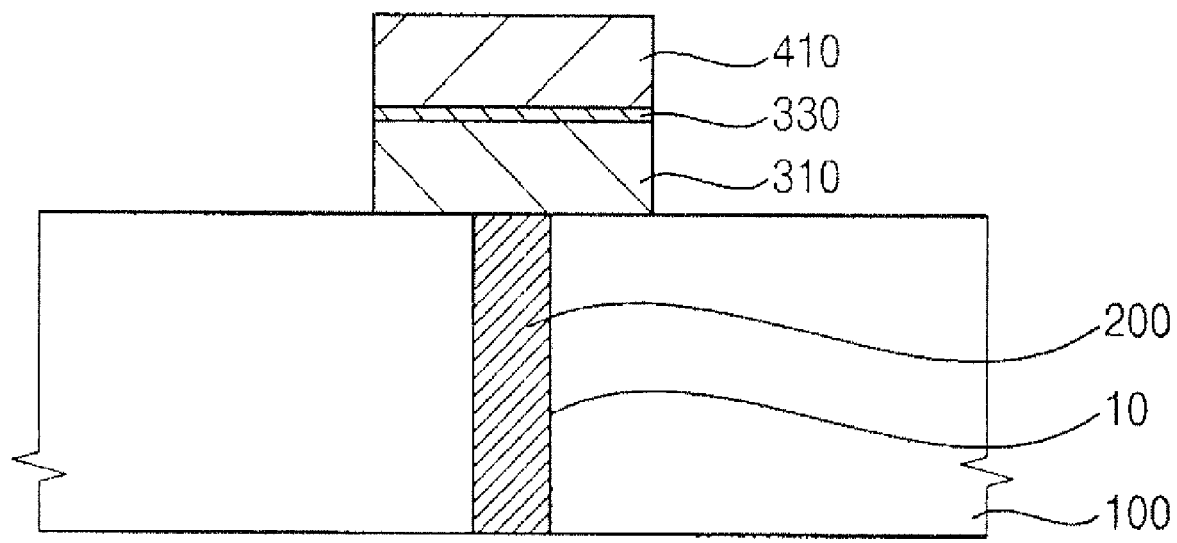

FIGS. 3 to 5 are cross-sectional views illustrating a method of forming the phase changeable structure in FIG. 2.

Referring to FIG. 3, a hole 10 is formed in an insulating layer 100. The insulating layer 100 may be formed by any known method or process, e.g., using oxide or nitride. For example, the insulating layer 100 may be formed using PSG, BPSG, USG, SOG, TEOS, PE-TEOS, FOX, HDP-CVD oxide or silicon nitride.

A lower electrode 200 is formed in the hole 10. The lower electrode 200 is formed using metal, metal nitride or a combination thereof. For example, the lower electrode 200 is formed using tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or any combination thereof. Alternatively, the lower electrode 200 is formed using polysilicon doped with impurities. Here, an upper face of the insulating layer 100 is substantially coplanar with an upper face of the lower electrode 200.

A phase changeable layer 300 is then formed on the insulating layer 100 and the lower electrode 200. The phase changeable layer 300 may include a chalcogenide. The chalcogenide may include germanium, antimony and tellurium.

A conductive etch stop layer 350 is then formed on the phase changeable layer 300. The etch stop layer 350 may be formed using an etch stop conductive material allowing the etch stop layer 350 to have a first etch rate with respect to a first etching material including chlorine.

A conductive layer 400 is formed on the etch stop layer 350. The conductive layer 400 may be formed using an upper electrode conductive material allowing the conductive layer 400 to have a second etch rate with respect to the first etching material. The second etch rate is preferably higher than the first etch rate.

The upper electrode conductive material may include tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or any combination thereof. Alternatively, the upper electrode conductive material may include polysilicon doped with impurities.

For example, when the etch stop conductive material is zirconium, the upper electrode conductive material is preferably titanium nitride. This is because, when the etch stop layer 350 and conductive layer 400 include zirconium and titanium nitride, respectively, the etch rate of the etch stop layer 350 with respect to the first etching material is higher than the etch rate of the conductive layer 400 with respect to the first etching material.

The conductive layer 400 may be formed by any known process or method. Nonlimiting examples of useful processes or methods include sputtering, chemical vapor deposition (CVD), electron beam deposition, atomic layer deposition (ALD), or pulse laser deposition (PLD).

A mask pattern 500 is then formed on the conductive layer 400. The mask pattern 500 may include a material that can be slightly removed while the conductive layer 400, the etch stop layer 350 and the phase changeable layer 300 are etched.

Referring to FIG. 4, a first etching process is performed on the conductive layer 400 by using the mask pattern 500 as an etch mask. Thus, the conductive layer 400 may be transformed into a plurality of upper electrodes 410.

The first etching process may be preformed using the first etching material including chlorine-containing compound, e.g., $Cl_2$ and $BCl_3$. The first etching material may further include other useful etchant compounds, nonlimiting examples of which include a halogen compound or noble gas selected from the group consisting of helium, neon, argon, krypton, xenon, radon, and any combination thereof. The first etching material may have a plasma state.

The first etching process may be preformed in a chamber having a source electrode and a bias electrode. The bias electrode is typically installed at a chuck located at a lower portion of the chamber. The source electrode may be located at an upper portion of the chamber. Here, the source electrode and the bias electrode may change a state of the first etching material into a plasma state.

Particularly, a first electric power and a second electric power are applied to the source electrode and the bias electrode, respectively. When a ratio of the first electric power to the second electric power is less than about 2.5:1, it is believed that the efficiency of the first etching process is relatively poor. On the other hand, when the ratio of the first electric power to the second electric power is greater than about 20:1, it is believed that the first etching process will be difficult to control. Accordingly, it is preferred to utilize ratio of the first electric power to the second electric power from about 2.5:1 to about 20:1.

When the chamber is maintained at a pressure of less than about 1 mTorr, it is believed that the efficiency of the first etching process can be relatively poor. On the other hand, when the pressure of the chamber is greater than about 20 mTorr, it is believed that the first etching process will be difficult to control. Thus, it is preferred to maintain the pressure of the chamber at about 1 mTorr to about 20 mTorr.

When the flow rate of argon with respect to a flow rate of chlorine is at a ratio of less than about 2:1, it is believed that it will be difficult to allow the first etching material reach the plasma state. On the other hand, when the ratio of a flow rate of argon with respect to the flow rate of chlorine is greater than about 5:1, the conductive layer 400 may not be efficiently etched. Thus, it is preferably to maintain the ratio of the flow rate of argon with respect to the flow rate of chlorine at about 2:1 to about 5:1.

When the first etching material (e.g., including chlorine) contacts the phase changeable layer 300 in the first etching process, the first etching material may chemically react with the phase changeable layer 300 to generate defects. Particularly, when the phase changeable layer 300 includes germanium, antimony and tellurium, a chemical reaction between chlorine and antimony may be excessive. Thus, the atomic percentages of the chalcogenide may be undesirably altered.

In order to prevent such undesirable changes in the characteristics of the chalcogenide, the etch stop layer 350 is located under the conductive layer 400 in accordance with the present embodiment of the present invention. Thus, it is believed that the phase changeable layer 300 is physically protected by the etch stop layer 350 from the first etching material in the first etching process.

In addition, because the etch stop layer 350 is provided under the conductive layer 400, the first etching process may be performed very close to completion, e.g., until bridges formed between the upper electrodes 410 are completely removed.

Referring to FIG. 5, a second etching process is then performed. The second etching process, using a second etching material that is substantially free of chlorine, is performed on the etch stop layer 350 and the phase changeable layer 300. Thus, the etch stop layer 350 and the phase changeable layer 300 may be transformed into an etch stop pattern 330 and a phase changeable pattern 310, respectively. The etch stop pattern 330 and the phase changeable pattern 310 are provided between the upper electrode 410 and the lower electrode 200.

As previously discussed, when the second etching material includes chlorine, chlorine may be chemically reacted with the phase changeable layer 300 to generate defects. Particularly, the defects may be generated at a side face portion of the phase changeable pattern 310. Thus, a size of the side face portion may decrease.

Particularly, when the phase changeable layer 300 includes germanium, antimony and tellurium, a chemical reaction between chlorine and antimony is excessive. Thus, an atomic percentage of antimony decreases. As a result, it is desirable that the second etching material does not include chlorine.

The second etching material may include a noble gas selected from the group consisting of helium, neon, argon, krypton, xenon, radon, and any combination thereof In this case, the second etching material is preferably in a plasma state.

The second etching material may further include a fluorine-containing compound and/or a hydrogen-containing compound. Nonlimiting examples of useful fluorine-containing compounds can be selected from the group consisting of tetraflouromethane, trifluoromethane, difluoromethane, monofluoromethane, and any combination thereof. Nonlimiting examples of useful hydrogen-containing compounds can be selected from the group consisting of $H_2$, HBr, $NH_3$, $N_2H_4$, $C_xH_y$ (e.g., $CH_4$), and any combination thereof. Any $C_xH_y$ gas, which might be utilized, can be straight-chained or ringed. All of these additional etching materials can be used in a mixture with helium, neon, argon, krypton, xenon, radon or any combination thereof.

EXAMPLE 1

A chamber was prepared. A chuck (at which a bias electrode was installed) was located at a lower portion of the chamber. A source electrode was located at an upper portion of the chamber. A titanium nitride layer was disposed onto the chuck. In this example, the chuck was used to simulate a wafer.

The chamber was maintained at a pressure of about 15 mTorr. A first etching material was introduced into the chamber. The first etching material included argon and chlorine. The flow rate of argon with respect to the flow rate of chlorine was set at a ratio of about 3.3:1. Particularly, the flow rate of argon and the flow rate of chlorine were about 100 Sccm and about 30 Sccm, respectively.

A first electric power and a second electric power were applied to the source electrode and the bias electrode, respectively. The first electric power with respect to the second electric power was set at a ratio of about 13.3:1. Particularly, the first electric power and the second electric power were about 1,000 Watt and about 75 Watt, respectively. The first etching material had a plasma state due to the first and second electric powers.

The first etching material etched the titanium nitride layer was at an etch rate of about 33.4 Å/sec.

The titanium nitride layer was then removed from the chamber. A zirconium layer was disposed onto the chuck of the chamber. The zirconium layer was etched under conditions substantially the same as those employed in etching the titanium nitride layer. The zirconium layer was etched at an etch rate of about 1.19 Å/sec.

That is, a ratio of the etch rate of the titanium nitride layer with respect to the etch rate of the zirconium layer was about 28.1:1. Because the ratio of the etch rate of the titanium nitride layer with respect to the etch rate of the zirconium layer was relatively high, it was believed that the zirconium layer may be used as an etch stop layer while the titanium nitride layer was etched using the first etching material.

EXAMPLE 2

A chamber was prepared. A chuck was located at a lower portion of the chamber. A bias electrode was installed at the chuck. A source electrode was located at an upper portion of the chamber. A titanium nitride layer was disposed on the chuck. In this example, the chuck was used to simulate a wafer.

The chamber was maintained at a pressure of about 10 mTorr. A first etching material was introduced into the chamber. The first etching material included argon and chlorine. The flow rate of argon with respect to a flow rate of chlorine was set at a ratio of about 3:1. Particularly, the flow rate of argon and the flow rate of chlorine were about 60 Sccm and about 20 Sccm, respectively.

A first electrode and a second electrode were applied to the source electrode and the bias electrode, respectively. The first electric power with respect to the second electric power was set at a ratio of about 18.7:1. Particularly, the first electric power and the second electric power were about 14.00 Watt and about 75 Watt, respectively. The first etching material had a plasma state due to the first and second electric powers.

The titanium nitride layer was etched using the first etching material. The etch rate of the titanium nitride layer was about 21 Å/sec.

The titanium nitride layer was removed from the chamber. A zirconium layer was disposed onto the chuck of the chamber. The zirconium layer was etched under conditions substantially the same as those used in etching the titanium nitride layer. An etch rate of the zirconium layer was about 1.2 Å/sec.

That is, a ratio of the etch rate off the titanium nitride layer with respect to the etch rate of the zirconium layer was about 17.5:1. Because the ratio of the etch rate of the titanium nitride layer with respect to the etch rate of the zirconium layer was relatively great, the zirconium layer may be used as an etch stop layer while the titanium nitride layer was etched using the first etching material.

According to the present invention, it was believed that a phase changeable pattern provided between a lower electrode and an etch stop pattern may have a side face portion and an upper face portion having the reduced number of defects.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a phase changeable structure, the method comprising:
   forming a lower electrode;
   forming a phase changeable layer including a chalcogenide on the lower electrode;
   forming an etch stop layer on the phase changeable layer, the etch stop layer having a first etch rate with respect to a first etching material comprising chlorine;
   forming a conductive layer on the etch stop layer to obtain a stacked composite, the conductive layer having a second etch rate with respect to the first etching material, the second etch rate being higher than the first etch rate;
   etching the conductive layer by using the first etching material to form an upper electrode; and
   etching the etch stop layer and the phase changeable layer by using a second etching material that is substantially free of chlorine to form an etch stop pattern and a phase changeable pattern.

2. The method of claim 1, wherein the chalcogenide includes germanium, antimony and tellurium.

3. The method of claim 1, wherein the conductive layer comprises a metal selected from the group consisting of tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, copper, aluminum copper, alloys thereof, or any combination thereof.

4. The method of claim 3, wherein the conductive layer comprises titanium nitride, and wherein the etch stop layer comprises zirconium.

5. The method of claim 1, wherein the first etching material further comprises a noble gas selected from the group consisting of helium, neon, argon, krypton, xenon, radon, and any combination thereof.

6. The method of claim 5, wherein the etching step of the conductive layer further comprises,
   placing the stacked composite in an etching chamber having a source electrode and a bias electrode, and
   applying electrical power to the source electrode and the bias electrode at a ratio from about 2.5:1 to about 20:1.

7. The method of claim 6, wherein the etching step of the conductive layer is conducted at a pressure from about 1 mTorr to about 20 mTorr.

8. The method of claim 6, wherein the first etching material includes chlorine and argon, and wherein etching step of the conductive layer further comprises the step of introducing chlorine and argon into the chamber at a flow rate ratio from about 2:1 to about 5:1.

9. The method of claim 1, wherein the second etching material comprises a noble gas selected from the group consisting of helium, neon, argon, krypton, xenon, radon, and any combination thereof.

10. The method of claim 9, wherein the second etching material further comprises a fluorine-containing compound.

11. The method of claim 10, wherein the fluorine-containing compound is selected from the group consisting of tetrafluoromethane, trifluoromethane, difluoromethane, monofluoromethane, and any combination thereof.

12. The method of claim 9, wherein the second etching material further comprises a hydrogen-containing compound.

13. The method of claim 12, wherein the hydrogen-containing compound is selected from the group consisting of $H_2$, HBr, $NH_3$, $N_2H_4$, $C_xH_y$, and any combination thereof.

14. The method of claim 1, wherein the second etching material comprises a compound selected from the group consisting of helium, neon, argon, krypton, xenon, radon, tetrafluoromethane, trifluoromethane, difluoromethane, monofluoromethane, $H_2$, HBr, $NH_3$, $N_2H_4$, $C_xH_y$, and any combination thereof.

* * * * *

UNITED STATES PATENT AND TRADEMARK OFFICE
CERTIFICATE OF CORRECTION

PATENT NO. : 7,569,430 B2  Page 1 of 1
APPLICATION NO. : 11/674580
DATED : August 4, 2009
INVENTOR(S) : Jun-Soo Bae et al.

It is certified that error appears in the above-identified patent and that said Letters Patent is hereby corrected as shown below:

Title Page; item (57); Abstract, line 14, the word "flee" should read -- free --;
Column 1, line 28, the word "Aphase" should read -- A phase --;
Column 3, line 50, the word ""tipper"" should read -- "upper" --;
Column 3, line 51, the word "features" should read -- feature's --;
Column 7, line 3, the word "preformed" should read -- performed --;
Column 7, line 11, the word "preformed" should read -- performed --;
Column 9, line 44, the word "off" should read -- of --;
Column 9, line 63, the words "claims therefore," should read -- claims. Therefore, --.

Signed and Sealed this

Twenty-second Day of December, 2009

David J. Kappos
*Director of the United States Patent and Trademark Office*